(12) United States Patent
Papadimitrakopoulos et al.

(10) Patent No.: US 7,326,303 B2
(45) Date of Patent: Feb. 5, 2008

(54) SINGLE-PASS GROWTH OF MULTILAYER PATTERNED ELECTRONIC AND PHOTONIC DEVICES USING A SCANNING LOCALIZED EVAPORATION METHODOLOGY (SLEM)

(75) Inventors: Fotios Papadimitrakopoulos, Vernon, CT (US); Thomas Samuel Phely-Bobin, Marlborough, MA (US); Daniel Harrison Grantham, deceased, late of Storrs, CT (US); Faquir C Jain, Storrs, CT (US)

(73) Assignee: Optoelectronics Systems Consulting Inc., Storrs, CT (US)

( * ) Notice: Subject to any disclaimer, the term of this patent is extended or adjusted under 35 U.S.C. 154(b) by 0 days.

(21) Appl. No.: 11/327,756

(22) Filed: Jan. 9, 2006

(65) Prior Publication Data

US 2006/0118047 A1    Jun. 8, 2006

Related U.S. Application Data

(63) Continuation-in-part of application No. 10/159,670, filed on Jun. 3, 2002, now abandoned.

(51) Int. Cl.
*C23C 14/26* (2006.01)
*C23C 14/12* (2006.01)
(52) U.S. Cl. .............. 118/719; 118/724; 118/726; 118/729
(58) Field of Classification Search .............. 118/719, 118/724, 726, 729
See application file for complete search history.

(56) References Cited

U.S. PATENT DOCUMENTS 5,081,471 A * 1/1992 Thomas ............... 347/201
6,194,119 B1 * 2/2001 Wolk et al. ............ 430/200
2003/0230238 A1* 12/2003 Papadimitrakopoulos et al. .............. 118/715

FOREIGN PATENT DOCUMENTS

JP    2002-302759    * 10/2002

* cited by examiner

Primary Examiner—Richard Bueker
(74) Attorney, Agent, or Firm—H.C. Lin Patent Agent

(57) ABSTRACT

This invention describes an apparatus, Scanning Localized Evaporation Methodology (SLEM) for the close proximity deposition of thin films with high feature definition, high deposition rates, and significantly improved material economy. An array of fixed thin film heating elements, each capable of being individually energized, is mounted on a transport mechanism inside a vacuum chamber. The evaporable material is deposited on a heating element. The SLEM system loads the surface of heating elements, made of foils, with evaporable material. The loaded thin film heating element is transported to the substrate site for re-evaporation. The re-evaporation onto a substrate, which is maintained at the desired temperature, takes place through a mask. The mask, having patterned openings dictated by the structural requirements of the fabrication, may be heated to prevent clogging of the openings. The translation of the substrate past the evaporation site permits replication of the pattern over its entire surface. A multiplicity of fixed thin film heating element arrays is provided that can operate simultaneously or in sequence. Multi-layered structures of evaporable materials with high in-plane spatial pattern resolution can be deposited using this apparatus. In one version of the invention, the transport of the evaporant-loaded thin film heating elements is accomplished by the use of cylindrical rotors on whose circumference the heating elements are mounted.

1 Claim, 8 Drawing Sheets

SINGLE-PASS GROWTH OF MULTILAYER PATTERNED ELECTRONIC AND PHOTONIC DEVICES USING A SCANNING LOCALIZED EVAPORATION METHODOLOGY (SLEM)

This application is a continuation-in-part of application Ser. No. 10/159,670, filed Jun. 3, 2002 now abandoned.

BACKGROUND OF THE INVENTION

1. Field of the Invention

This invention relates to the use of a scanning localized evaporation methodology for processing of multilayer, patterned electronic and photonic devices, such as transistors, sublimable organic light-emitting diodes (OLEDs), photonic band gap structures, and integrated circuits/systems. One example is the fabrication of displays using OLEDs for applications ranging from computer monitors to personal digital assistant (PDAs).

2. Description of the Related Art

Introduction:

A typical display screen comprises of a regular array of color pixels, each of which can be electrically selected to emit red, green and blue colored light, resulting in a desired shade and brightness. Each pixel is comprised of three devices, a red, a green, and a blue light-emitting element. Liquid crystal displays make use of color filters whose transmissions are selectively blocked to produce red, green, blue pixels. By choosing a single device or a combination of the three, a wide range of colors can be produced. Pixels are produced via patterning of one or more thin film layers deposited on a suitable substrate.

In the traditional electronics industry, lithographic and etching techniques are used to selectively remove portions of the blanket films, leaving behind the desired pattern.[1] Recently, display,[2] electronic[3, 4] and photonic devices, [5, 6] using organic semiconducting materials (of both low and high molecular weight), have shown certain advantages over traditional inorganic materials. These organic materials, due to the chemical sensitivity to both solvents and lithographic procedures, however, require new fabrication methodologies for both deposition and patterning.[7, 8]

One of the techniques typically employed is evaporation of these materials through shadow masks.[9] This process is limited to relatively large feature sizes. For finer features/ pixel sizes, smaller pre-deposited patterns of inert resist materials are employed to serve as shadow masks.[10] In another methodology, films are deposited on substrates on which have been produced three-dimensional pyramidal structures with triangular bases, each face corresponding to the one of the three primary colors.[11] These techniques, however, have a number of limitations, such as cost associated with background patterning and multi-step batch processing. Until recently, due both to their high purity and to the ease of producing multilayer device structures,[12-15] sublimable organics have been in the forefront of display and transistor development. However, the fabrication of fill color displays through the adaptation of ink-jet printing for polymeric semiconductor has provided an alternate technology.[16-18] This technology requires the use of specialized substrates. These substrates must have indentations, exhibiting controlled wetting characteristics, which serve as micro-containers or wells for localizing the deposited polymeric solution, prior to drying.

Forrest et al. [19] reported a systematic and quantitative study on the design and limitations of OLED-based flat panel displays (FPDs). Among the various addressing schemes used in electronic displays,[20] direct and matrix addressing are suitable for OLEDs. The direct addressing scheme, where each pixel is connected to an individual driver, can only be used for discrete indicators and simple alphanumeric displays with few characters. In a matrix-addressed display, pixels are organized in rows and columns, and each pixel is electrically connected between one row lead and one column lead. The addressing schemes, where active electronic components are added to the pixels, are called active-matrix addressing;[21] while those without extra active components are termed passive-matrix addressing.[22]

FIG. 1 shows typical passive (a) and active matrix (b) architectures for full color organic light emitting diode (OLED) flat panel displays (FPDs). The red (8), green (9) and blue (10) electroluminescent (EL) materials 2 shown separately in FIG. 1c and combined as layer 2 in FIG. 1a and 1b are typically sandwiched between transparent conducting indium tin oxide (ITO) and metallic cathode electrodes to produce separate red, green and blue light emitting areas, which constitute a full color pixel. The major difference between the passive matrix architecture and the active matrix architecture is in the patterns of the electrodes. For the passive architecture, the cathode 1 and the anode 3 consist of line structures that intersect perpendicularly to define the elements of the full color pixel, any one of which can be activated by powering the row and column defining that element, whether it be red, green or blue. For the active matrix architecture, the emitting materials 2 are sandwiched between the ITO pads 5 and the common cathode 4.[23] Not shown in FIG. 1b are the addressable transistors, which connect the individual ITO pads 5 of each pixel element of the full-color display.

A typical OLED construction starts with ITO patterns on the substrate 13, a common Anode Modifying Layer (AML) 12 (ie. copper phtalocyanine), Hole Transport Layer (HTL) 11 (i.e. N,N'-Bis(naphthalen-1-yl)-N,N'-bis(phenyl) red emitting layer 8 (i.e. 4% of 2,3,7,8,12,13,17,18-octaethyl-21H,23H-porphine platinum(II) (PtOEP) doped within aluminum (III) 8-hydroxyquinoline ($Alq_3$)), green emitting layer 9 (i.e. $Alq_3$ or 0.8% N,N-dimethyl quinacridone doped within $Alq_3$), and blue emitting layer 10 (i.e. lithium tetra-(8-hydroxy-quinolinato) boron ($LiBq_4$)), Electron Transport Layer (ETL) 7 (i.e. $Alq_3$ or bathocuproine (BCP)), Cathode Modifying Layer (CML) 6 (i.e. cesium floride or lithium floride), and Cathode Layers 1 or 4 (i.e. aluminum or magnesium). In reality, some of these layers might need to be different for each art.

FIG. 2 describes typical thin film vacuum evaporation method that relies on resistively heated boats or filaments 15 that deposit thin films on substrate 13 through a mask 14. The deposition source could also be a laser or e-beam heated target 15. Alternately, sputtering, plasma or glow discharge methods can be employed. All of the above deposition techniques generally require a significant distance to be maintained between source 15 and substrate 13 to obtain the desired film thickness uniformity.

SUMMARY OF THE INVENTION

This invention describes an apparatus for the close proximity deposition of thin films with high feature definition, higher deposition rates, and significantly improved material economy. The device loads the surface of fixed heating elements, made of thin films (20A-20000A), with evaporable material. The loaded thin film heating element is transported to the substrate site for the re-evaporation. The re-evaporation takes place through a mask onto a substrate maintained at the desired temperature. The mask, which comprises a pattern, dictated by the structural requirements of the device under fabrication, may be heated to prevent clogging. The translation of the substrate past the evaporation site replicates the pattern on its entire surface. The above cycle is herein termed as Scanning Localized Evaporation Methodology (SLEM). A multiplicity of evaporation sites through multiple SLEM fixtures is provided that can operate in parallel. Multilayered structures of evaporable materials with high in-plane spatial resolution can be deposited using this apparatus.

In one version of the invention, the transport of the evaporant-loaded heating elements is accomplished by the use of cylindrical rotors on which the heating elements are mounted. The heating element may be electrically powered by using resistive elements. These elements may be made of a pure material, which do not contaminate the evaporants. Refractory thin metal foils graphite and carbon nanotubes composites and doped semiconductor thin film are examples of suitable materials.

The features of this invention are:
(1) An array of reusable, long-lived, thin-film heaters that are capable of evaporating high purity materials,
(2) A means to load and replenish a multiplicity of evaporable materials on the heater array,
(3) A means to monitor the amount of evaporable material deposited on the heater array,
(4) A means to locally heat the evaporable material at the desirable substrate positions through an appropriate mask.
(5) A means of heating the shadow mask to prevent undesirable clogging of the fine features.
(6) The substrate(s) is(are) mounted on a high-speed, high-precision x-y stage with provisions for cooling, providing the ability to deposit compositionally homogeneous thin films uniform in thickness at specific sites.

OLED-based full color flat panel displays (FPDs), thin film electronic devices and photonic band gap structures, which conventionally employ multi-batch fabrication processes, can now be realized in one continual in-line vacuum system equipped with multi-segment SLEM rotors. The ability to tightly control both the patterning-resolution and layer thicknesses, particularly in multilevel structures, results in increased throughput while maintaining superior device performance.

DETAILED DESCRIPTION OF THE INVENTION

Figure 3:
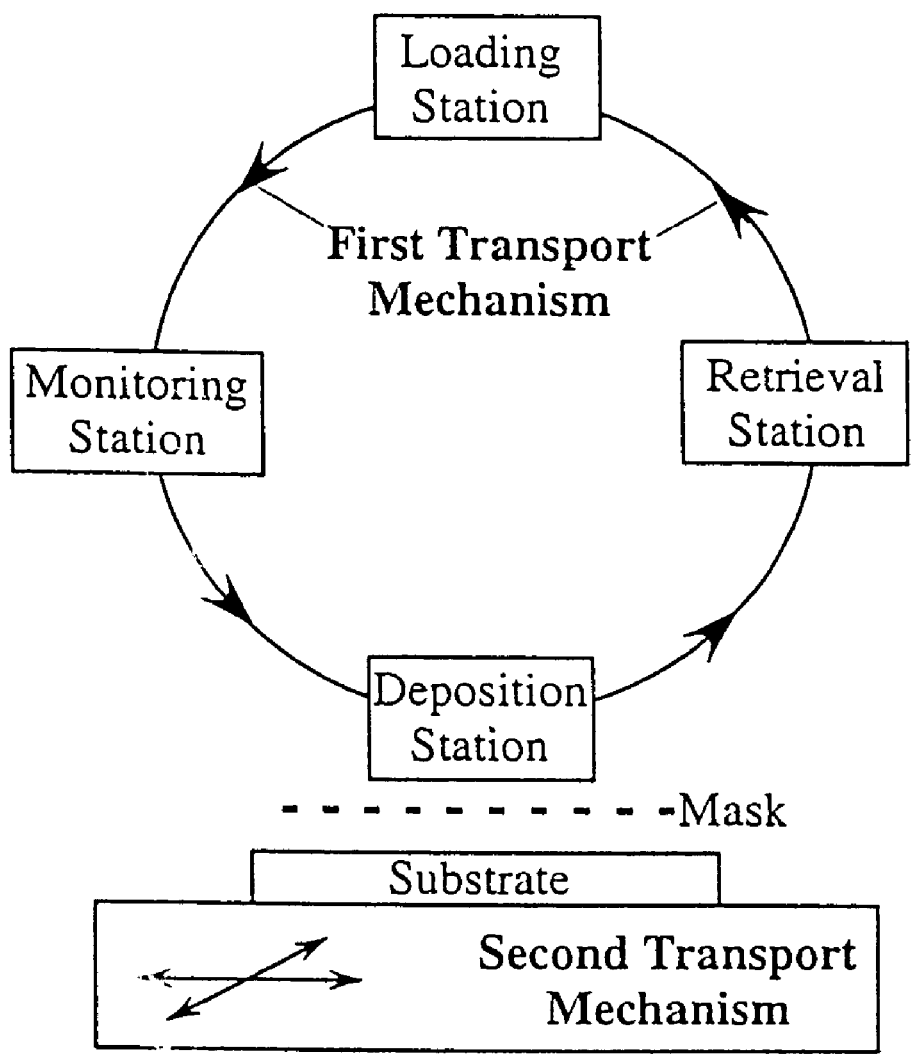
FIG. 3 illustrates the flowchart of the Scanning Localized Evaporation Methodology (SLEM) process.

FIG. 3 depicts schematically the Scanning Localized Evaporation Methodology (SLEM) process for depositing thin films onto substrates, which are placed in close proximity to the deposition source. A thin film deposition cycle begins at the loading station, where evaporation of a sublimable material commences on to an array of heater elements. The heater elements are mounted on a first transport mechanism. The thickness of the deposited film on a selected heating element can be determined at the monitoring station, when this heating element is positioned opposite to the monitoring station by the first transport mechanism. The same transport mechanism also brings the loaded heating elements to the deposition site. Here, the thin film is re-evaporated and deposited through a mask onto a substrate. The substrate is mounted on a second transport mechanism that provides the means to move and index it relative to the mask. In the case where the substrate is larger than the mask pattern, the indexed motion of the substrate permits precise replication and registration of the pattern across the full area of the substrate. The un-evaporated material from the heating element surface is finally removed and collected at the retrieval station. The loading, monitoring, deposition and retrieval of evaporable material constitutes a SLEM deposition cycle. Many of such deposition cycles may be used to achieve a desired device structure.

Figure 4:
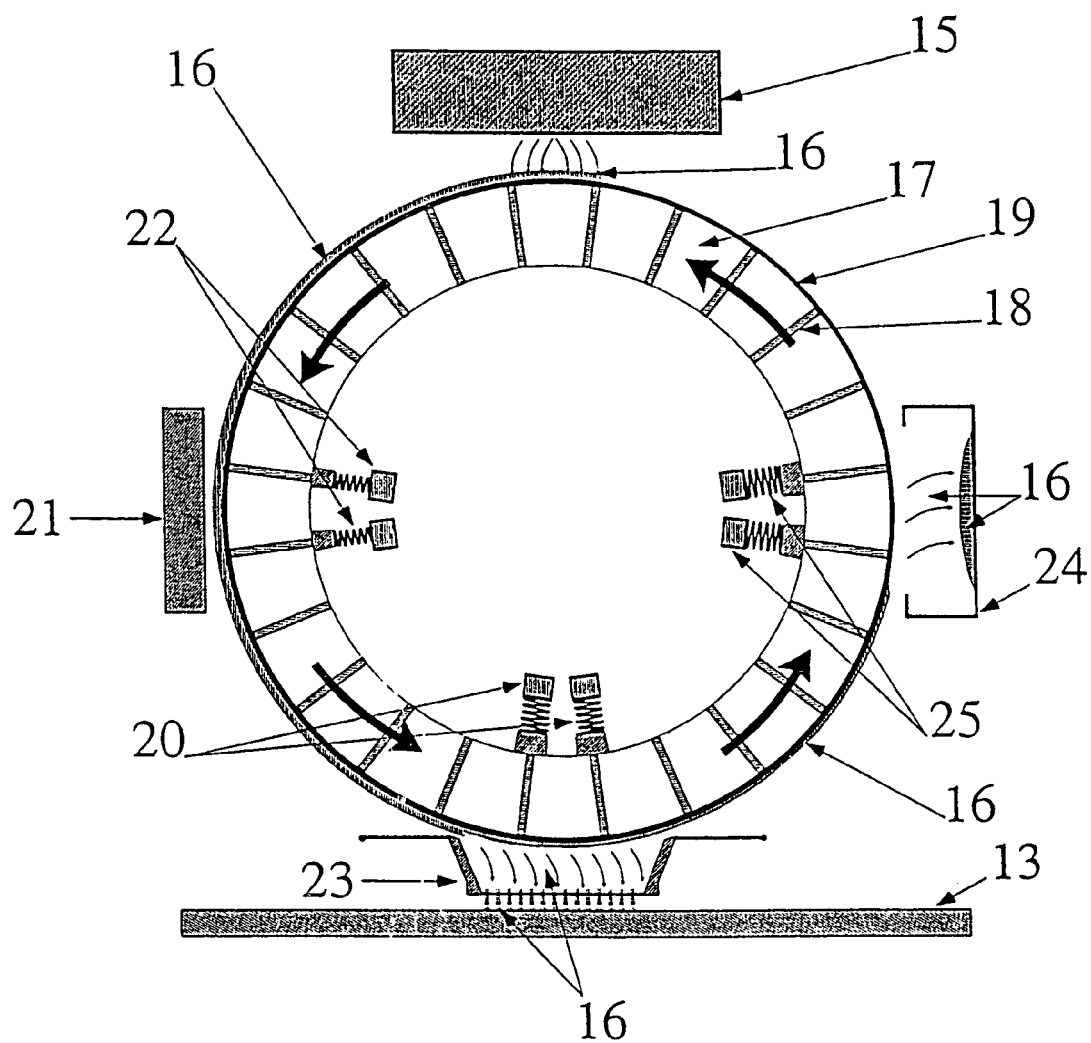
FIG. 4. shows schematically a typical SLEM apparatus.

In one case the transport mechanism may be a cylindrical rotor as shown in FIG. 4. Here, a thin low-thermal mass continuous strip heater, mounted on the circumference of the rotor, is used as an evaporant source for the vacuum deposition of thin films of various electronic materials, notably organic semiconductors. The thin film thus deposited has a thickness ranging between 30 Angstroms to 20,000 Angstroms. The thin film has lower thermal mass than the substrate resulting in fast evaporation due to enhanced temperature for a given electrical input energy. Since the evaporant films are comparable in thickness to heaters, they can be re-deposited on substrates (via a heated mask assembly (in a localized manner and with minimal heat. Conductive materials, such as metals, needed to make electrical contacts to organic semiconductor films, may also be deposited using this method. The rotor is attached to a shaft, which is driven by an external motor. The shaft may be a hollow tube carrying electrical wires and cooling lines to the rotors. The rotor may be of almost any dimension, its radius limited in size only by the dimensions of the vacuum chamber in which it is mounted. The thickness of the rotor disk is determined by such considerations as the size of the mask. Other sizing constraints are imposed by electrical power distribution system and cooling requirements.

The rotor 17 supports on its circumference a heating element 19 that can be made of either one continuous strip or of several discrete segments. This heating element 19 is comprised of, but is not limited to, a metallic foil, a carbon nanotube paper, a graphite paper, a doped semiconductor foil, or an electrically conductive fiber composite. Typically, the surface of the heating element 19 is coated with a layer 16 (see also FIG. 5) of a desired material from an evaporative loading source 15. Layer 16 is re-evaporated at the substrate location from the segment of the heating element 19, which is powered by appropriately placed electrodes 18, when the rotor aligns the designated segment with the brushes 20, contacting the inside of electrodes 18. The material 16 is deposited onto the substrate 13 through a mask 23 that may be heated to avoid clogging of the openings by the evaporant. The substrate 13 may be cooled to prevent any adverse effects due to an increase in temperature from the nearby heated mask 23 and heating element 19.

The mass of the material 16, which has been loaded onto the heating element 19, can be measured by a quartz crystal microbalance thickness monitor placed between the loading and deposition sites. For example, the rate of evaporation for a given electrical power to the heater segment 19 can be periodically measured by evaporating onto the thickness monitor 21 using the set of brushes 22. Alternatively, a passive technique such as, but not limited to, ellipsometry can be used to continuously measure the thickness of the deposited layer 16 on the heating element 19. This enables control of both deposition rate and thickness of the evaporated material on the substrate 13. The material remaining on the heating element 19, after the deposition of the evaporant on the substrate, may be recovered using the retrieval unit 24, powered by the set of brushes 25.

The rotor may be constructed from aluminum or its alloys where the conducting electrodes 18 are embedded in the rotor 17. The electrodes are insulated from the body of the rotor by embedding them in insulating anodized wells in the aluminum rotor or by insulating them using other materials. The high resistivity of the heating element 19, allows a number of heating zones to be simultaneously energized at the circumference of the rotor, without one heating element interfering with operation of another. The high resistivity of single wall carbon nanotubes (SWNTs) relative to that of tungsten makes it suitable for a localized thermal evaporation heater. In addition, the extremely high thermal conductivity of SWNTs also provides rapid cooling of the SWNT "paper" in regions where current does not flow, thus further localizing the evaporation area Alternatively, one can use electronic multiplexer circuits to power an array of heating elements with fewer electrical connections.

Figure 5:
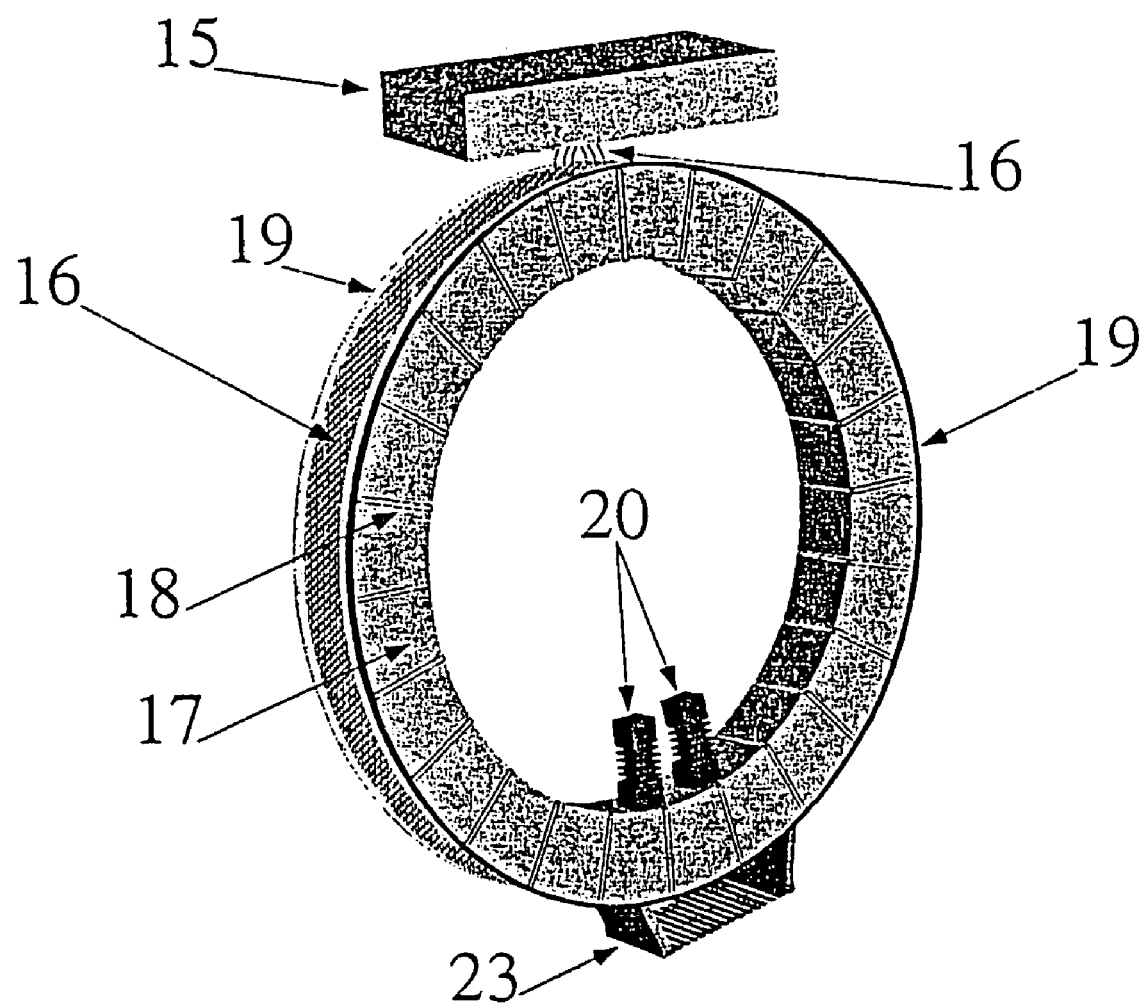
FIG. 5 shows a three-imensional illustration of a cylindrical SLEM rotor segment, showing loading and re-evaporation through a mask.

FIG. 5 is a three dimensional illustration of the SLEM rotor showing loading a material 16 from a source 15 on to the heater 19. The re-evaporation is accomplished when the appropriate heater segment is aligned with contacts or brushes 20 and mask assembly 23.

Figure 6:
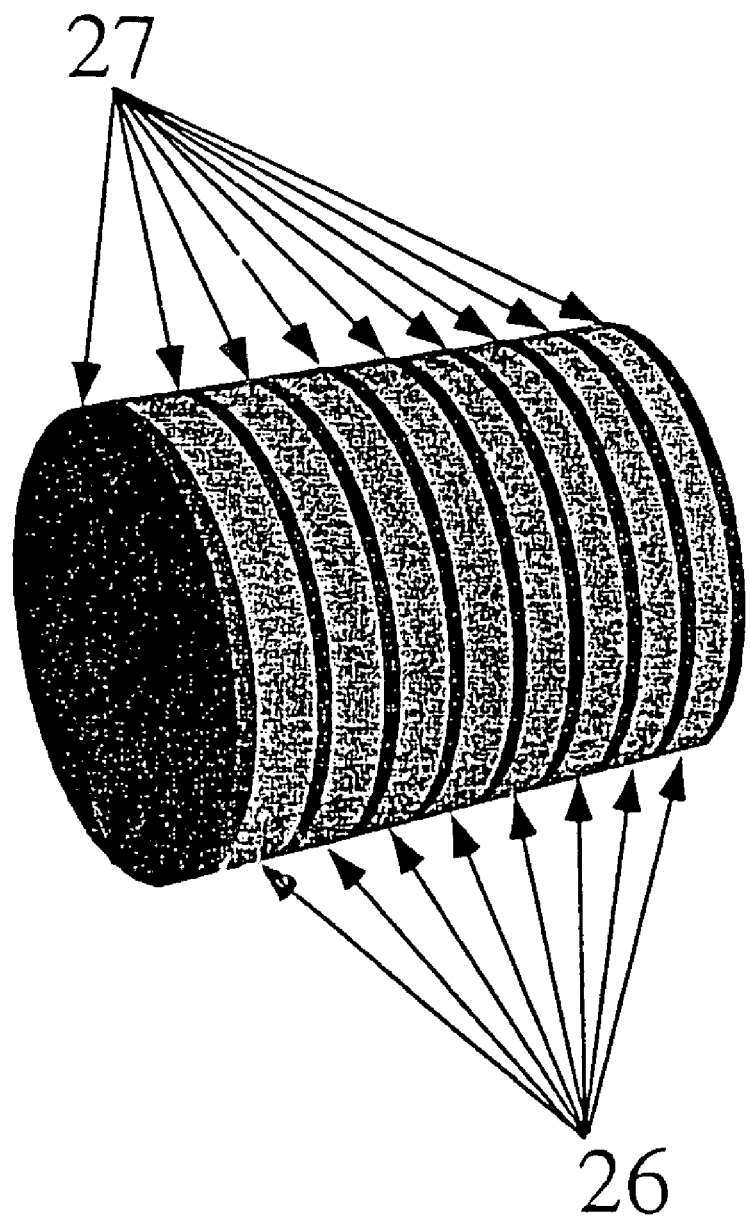
FIG. 6 shows illustration of a stacked SLEM rotor segment assembly, capable of depositing a number of films to realize a multi-layered thin film structure.

FIG. 6 shows a schematic illustration of an assembly of stacked-rotors capable of depositing a multiplicity of materials, one material per rotor, to realize multi-layered thin-film devices. The rotors 26 are separated by spacers 27, which can be used for cooling, ancillary drive mechanisms, or as insulating spacers.

Figure 7:
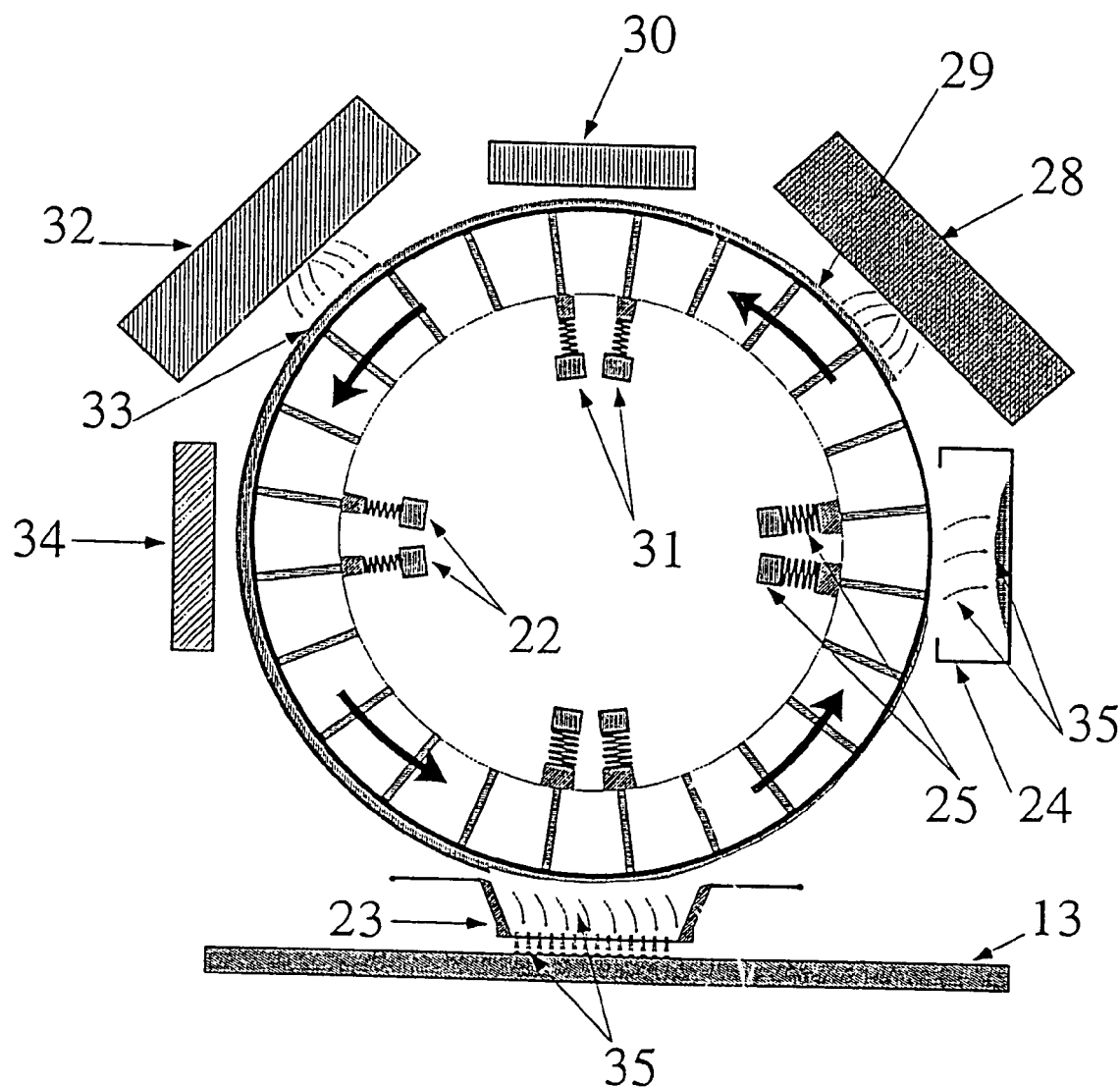
FIG. 7 shows an SLEM rotor, configured for co-evaporating two sublimable materials.

FIG. 7 shows a schematic illustration of a SLEM rotor capable of co-evaporating two sublimable materials. Two loading sources 28 and 32 are provided to deposit separate materials 29 and 33, respectively. Here, monitoring devices are shown as 30 for the first material 29, and 34 for the combination of material 29 and 33. The respective brushes, delivering power to these monitoring units, are 31 and 22. The two layers of materials 29 and 33 could be placed side by side on a heater surface or they can be stacked one on top of the other (as shown in FIG. 7), depending on the application. The relative thickness of layers 29 and 33 can be used to provide flexibility in materials composition of the co-evaporated film 35. Similarly, the composite film 35 is evaporated in a predetermined pattern on the substrate 13 using an appropriate mask 23. Any excess material 35 remaining on a heating element after re-evaporation is retrieved in a collector 24 by powering the segment contacted by the brushes 25.

The apparent sublimation temperature differences for the two materials 29 and 33 become insignificant at the localized evaporation region 35 due to the small amount of materials present at any time. Co-evaporation may be used to obtain a layer of one material doped with another.

Figure 1:
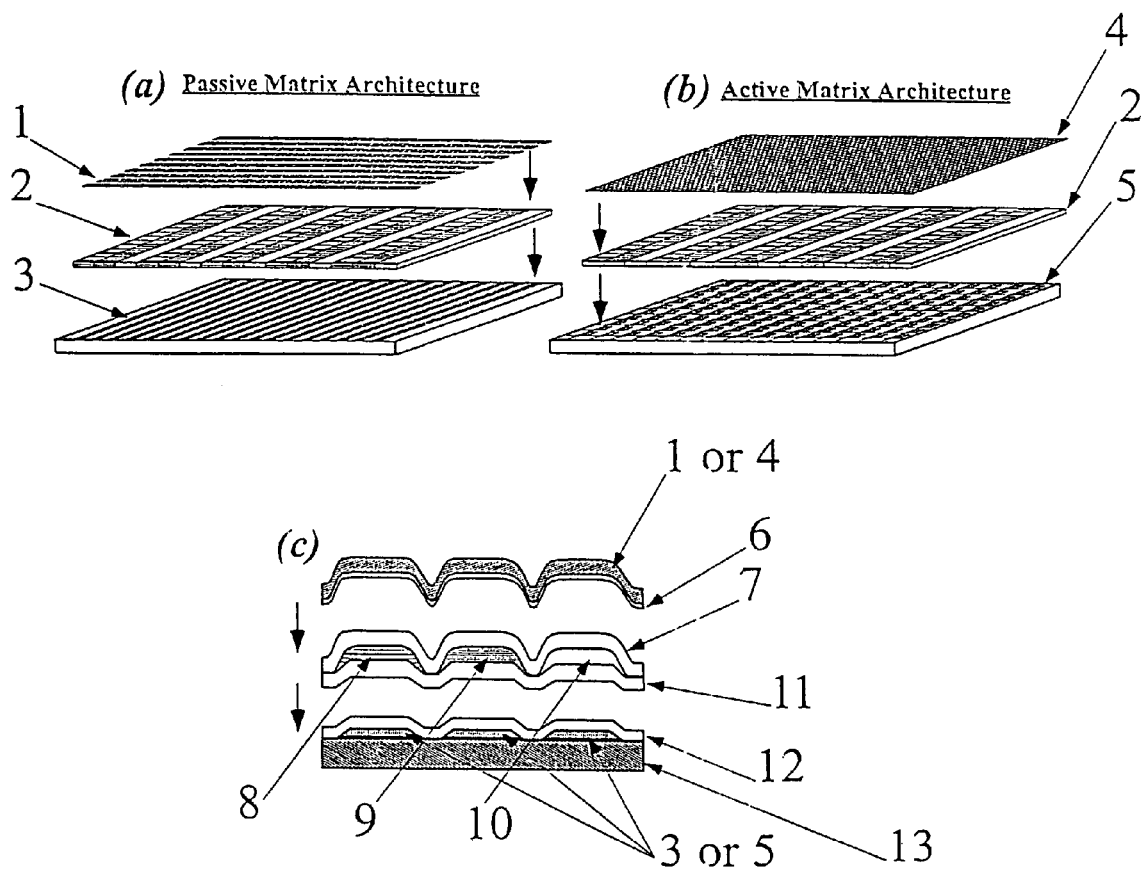
FIG. 1 shows typical passive (a) and active matrix (b) architectures for full color organic light emitting diode (OLED) flat panel displays (FPDs). The red, green and blue electroluminescent (EL) materials are typically sandwiched between ITO (a transparent conductors) and metallic cathode electrodes. (c) Representative "best case scenario" in terms of number of layers for a full color OLED FPD, relying on common AML, HTL, ETL, CML, and cathode layers. In reality, some of these layers might need to be different for each art.
Figure 2:
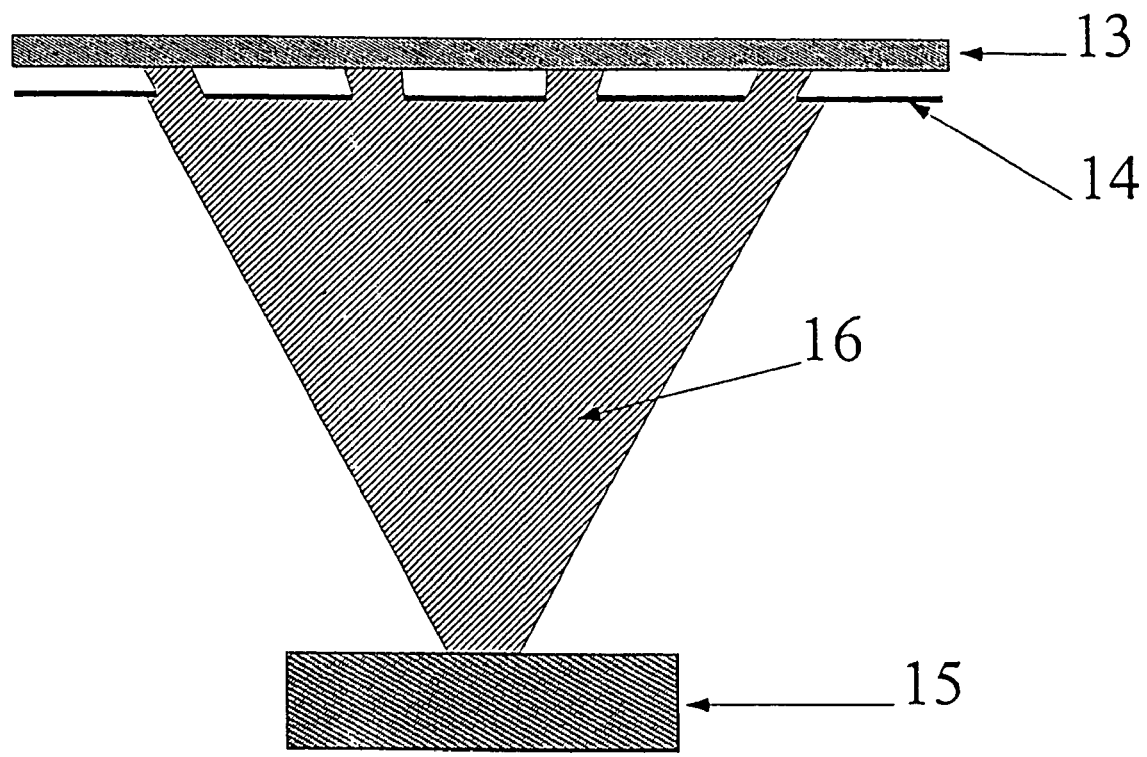
FIG. 2 describes a thin film vacuum evaporation method that relies on resistively heated boats or filaments 15 that deposits thin films on substrate 13 through a mask 14. The deposition source could also be a laser or e-beam heated targets 15. Alternately, sputtering, plasma or glow discharge methods can be employed. All of the above deposition techniques generally require a significant distance to be maintained between source 15 and substrate 13 to obtain the desired film thickness uniformity.
Figure 8:
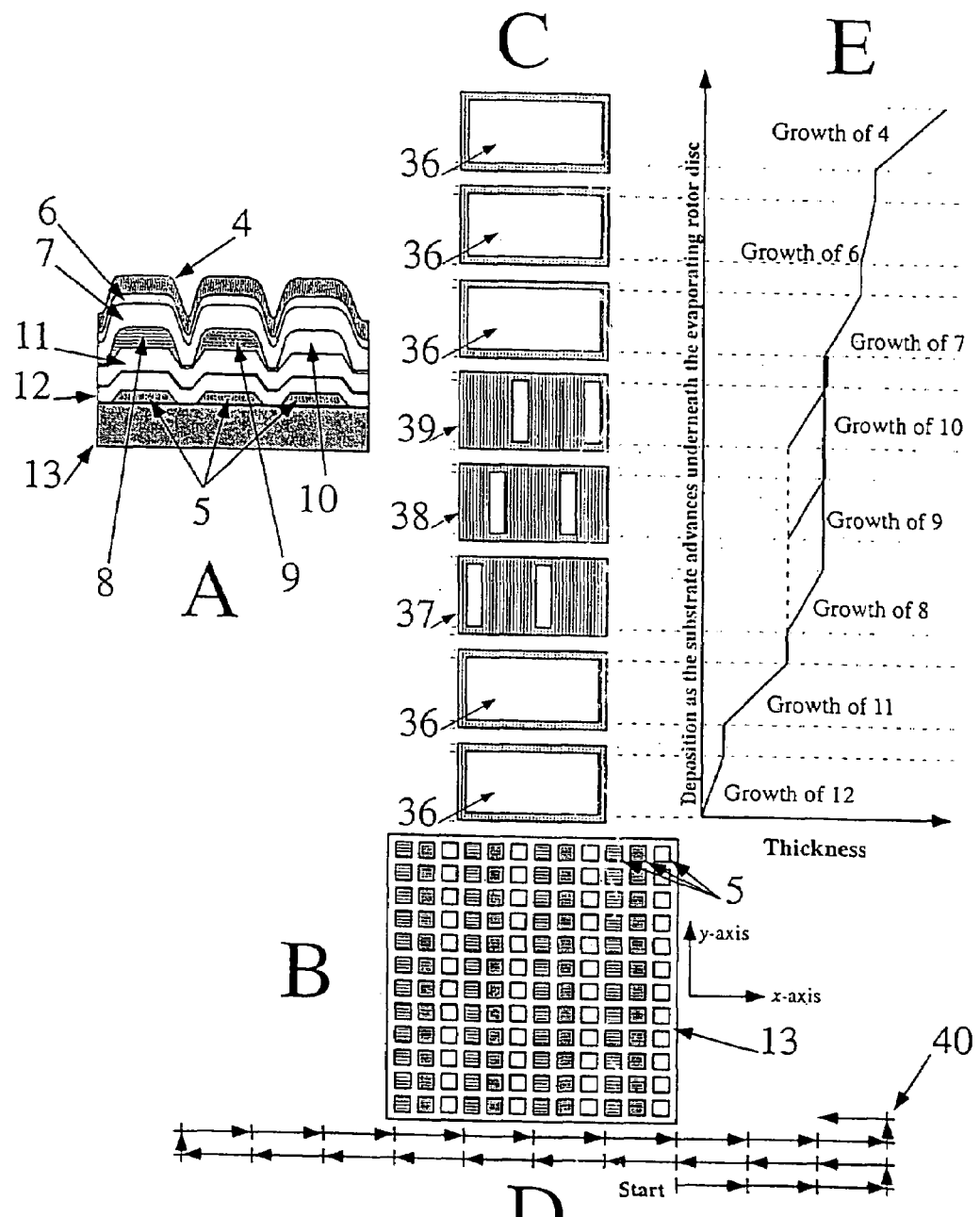
FIG. 8 shows schematic illustration of a typical deposition cycle to obtain a full color OLED flat panel display described in FIG. 1, using a stacked SLEM rotor segment assembly capable of depositing multi-layered structures on a substrate, whose position is controlled by a precision x-y stage.

FIG. 8 illustrates schematically the typical SLEM deposition cycle to obtain a full color OLED FPD, using a stacked-rotor assembly capable of depositing multi-layered devices on a substrate 13. Here, the position of substrate 13 (FIG. 8B) is indexed with respect to the masks (FIG. 8C) and moved by a precision x-y stage. Alternatively, the rotor assembly along with its masks may be translated and indexed above a substrate. Herein, a typical active-matrix addressed OLED display, as shown in FIGS. 1(*b*) and 1(*c*) (also shown in FIG. 8A for clarity), requires eight different materials (12, 11, 10, 9, 8, 7, 6 and 4) to be deposited in the indicated sequence, onto selected locations 5. This is accomplished using an array of eight SLEM rotors (each dedicated to an individual material), like the one shown in FIG. 6. The specific arrangement of the eight stationary masks 36, 36, 37, 38, 39, 36, 36, 36 located at the rotor site facing the substrate, is referenced to the pixel spacing, as indicated by the location of the ITO pads 5 on the substrate 13, having in this example 12 rows and 12 columns making a 12×4 RGB array shown in FIG. 8B. In our scheme, red, green and blue elements, indicated with R, G, B ITO pads 5, constitute a full color pixel. The configuration of these elements may be positioned linearly along the x-axis (FIG. 8B), or in an other manner.

Since layers of five materials (12, 11, 7, 6, 4) are deposited uniformly through out the entire substrate, common masks 36 comprised of open windows are employed (FIG. 8C). The need to deposit red 8, green 9 and blue 10 emitting layers at the specified ITO locations requires the use of patterned masks 37, 38 and 39 respectively.

The substrate 13 is mounted on the x-y stage, which is first scanned following the pattern 40 (FIG. 8D). A typical scanning cycle completes the scanning of all the columns of the substrate 13 along the x-axis, in steps equivalent to three ITO pad elements (including their interpad spacing), before advancing a step along the y-axis 40. This process is repeated until the entire substrate traverses throughout all eight masks.

FIG. 8E illustrates the manner in which the deposition of various evaporants (12, 11, 8, 9, 10, 7, 6 and 4) progresses as the substrate advances past the rotor discs. The evaporation of various materials can be started and stopped in time significantly shorter than the time required to advance the substrate to the next step. This prevents cross-contamination between pixels and also provides desired thickness uniformity. The required thickness of a particular layer, determined by its function, can be attained by varying the residence time, the rate of evaporation and length of the mask.

The novelty of SLEM arises from its close proximity evaporation, the in-situ patterning, and completion of a device structure (consisting of multiple layers) in a single vacuum pump down step. Current projections indicate deposition times is in the range of 3 to 7 minutes for growing a 3"×4" OLED display, consisting of an array of 270×360 pixels.

While the preferred embodiments of the invention have been described, it will be apparent to those skilled in the art that various modifications may be made in the embodiments without departing from the spirit of the present invention. Examples of such modified embodiments, which are within the scope of this invention, include the heater element materials such as nanotube carbon paper with appropriate resistivity (SWNT), and tungsten films. We have described a typical transport mechanism using the example of a cylindrical rotor structure. However, its shape and design can be varied depending on the application. In addition, delivery of power to the heater elements can be realized in a variety of ways, including brushes or multiplexing circuits. Variations are envisioned in the configuration of the evaporation sources, substrates holding fixtures, and mask configurations. Either the heater array or the substrate(s) is mounted on a high-speed, high-precision x-y stage, providing the ability to deposit compositionally homogeneous thin films with high thickness uniformity, in a site-specific manner.

Although we have described organic electroluminescent (EL) devices, the SLEM methodology is adaptable to the patterned growth of organic transistors, photonic crystals, and inorganic based technologies required for the fabrication of integrated circuits.

REFERENCES

1. B. El-Kareh: "Fundamentals of Semiconductor Processing Technologies". 1995, Kluwer Academic Publishers, Boston, Ma. pp. 599.
2. A. Cambridge: "Flat-panel displays: advanced organic materials by S. Kelly", 2001, Chem. Ind., London, U. K., (13), pp. 410.
3. F. Schauer, et al.: "Organic phthalocyanine films with high mobilities for efficient field-effect transistor switches", J. Non-Cryst. Solids, 266-269(Pt. B), 2000, pp. 999-1003.
4. H. Sirninghaus, et al.: "Bis(dithienothiophene) organic field-effect transistors with a high ON/OFF ratio", Appl. Phys. Lett., 71(26), 1997, pp. 3871-3873.
5. E. Yablonovitch: "Photonic crystals: Semiconductors of light", Scientific American, 285(6), 2001, pp. 46-51, 54-55.
6. S. John: "Localization of light: theory of photonic band gap materials", NATO ASI Ser., Ser. E, 315(Photonic Band Gap Materials), 1996, pp. 563-665.
7. P. E. Burrows, et al.: "Achieving full-color organic light emitting devices for lightweight, flat-panel displays", IEEE Trans. Electron Devices, 44, 1997, pp. 1188-1203.
8. R. Leuschner, et al.: "The Top-CARL process: a patterning technique for organic materials", Adv. Mater. (Weinheim, Fed. Repub. Ger.), 4(11), 1992, pp. 753-756.
9. P. F. Tian, et al.: "Photolithographic patterning of vacuum-deposited organic light emitting devices", Appl. Phys. Lett., 71, 1997, pp. 3197-3199.
10. C. Py, et al.: "An integrated shadow-mask based on a stack of inorganic insulators for high-resolution OLEDs using evaporated or spun-on materials", Synth. Met., 122(1), 2001, pp. 225-227.
11. Y. Yang, et al.: "Pyramid-shaped pixels for full-color organic emissive displays", Applied Physics Letters, 77(7), 2000, pp. 936-938.
12. J. R. Sheats, et al.: "Organic Electroluminescent Devices", Science, 273, 1996, pp. 884-888.
13. C. W. Tang, et al.: "Electroluminescence of Doped Organic Thin Films", J. Appl. Phys., 65, 1989, pp. 3610-3615.
14. J. Kido, et al.: "Multilayer White Light Emitting Organic Electroluminescent Device", Science, 267, 1995, pp. 1332.
15. J. Kido, et al.: "White-Light-Emitting Organic Electroluminescent Device Using Lathanide Complexes", Jpn. J. Appl. Phys., 35, 1996, pp. L384-L396.
16. Y. Yang, et al.: "Organic/polymeric electroluminescent devices processed by hybrid ink-jet printing", J. Mater. Sci.: Mater. Electron., 11(2), 2000, pp. 89-96.
17. S.-C. Chang, et al.: "Multicolor organic light-emitting diodes processed by hybrid inkjet printing", Adv. Mater. (Weinheim, Ger.), 11(9), 1999, pp. 734-737.
18. S. P. Speakman, et al.: "High performance organic semiconducting thin films: Ink jet printed polythiophene [rr-P3HT]", Organic Electronics, 2(2), 2001, pp. 65-73.
19. G. Gu, et al.: "Design of Flat-Panel Displays Based on Organic Light-Emitting Devices", IEEE, J of Selected Topics is Quantum Electronics, 40(1), 1998, pp. 83-99.
20. L. E. Tannas: "Flat Panel Displays and CRTs". 1985, New York: Van Nostrand Reinhold
21. O. Prache: "Active matrix molecular OLED microdisplays", Displays, 22(2), 2001, pp. 49-56.
22. T. van de Biggelaar, et al.: "Passive and active matrix addressed polymer light-emitting diode displays", Proceedings of SPIE—The International Society for Optical Engineering, 4295(Flat Panel Display Technology and Display Metrology II), 2001, pp. 134-146.
23. V. Bulovic, et al.: "A surface-emitting vacuum deposited organic light emitting device", Appl. Phys. Lett., 70, 1997, pp. 2954-2956.

Having thus described the invention, what is claimed is:

1. A thin film deposition unit for depositing an evaporated material on a substrate comprising:
   (a) a vacuum chamber;
   (b) a loading station adapted to support a material to be evaporated and including means for evaporation of the material;
   (c) at least one fixed thin film heater element;
   (d) a first transport mechanism for movement of said thin film heater element to locate at least one heater element adjacent said loading station to receive thereon a layer of material evaporated thereat;
   (e) a stage for supporting at least one substrate thereon;
   (f) a second transport mechanism for moving a substrate to a multiplicity of indexed positions;
   (g) stationary heated mask cooperating with said stage to provide a mask adjacent to and over a substrate thereon; and
   (h) actuating means for said heater element to evaporate a material through said stationary heated mask and deposit upon the substrate in a pattern determined by said mask, said second transport mechanism enabling the material evaporated from said fixed thin film heater to be deposited on the substrate at the indexed positions,
   wherein said thin film constituting said fixed film heater has low thermal mass having rapid temperature rise in comparison with underlying said substrate, and
   wherein said heater elements are comprised of at least one layer of an electrically resistive material of carbon nanotubes.

* * * * *